United States Patent [19]

Szydlo et al.

[11] Patent Number: 4,728,997
[45] Date of Patent: Mar. 1, 1988

[54] METHOD OF FABRICATING A LIGHT IMAGE DETECTOR AND A LINEAR IMAGE DETECTOR OBTAINED BY THIS METHOD

[75] Inventors: Nicolas Szydlo, Ris Orangis; Francois Boulitrop, Sceaux, both of France

[73] Assignee: Thomson-CSF, Paris, France

[21] Appl. No.: 895,812

[22] Filed: Aug. 12, 1986

[30] Foreign Application Priority Data

Aug. 14, 1985 [FR] France ................. 8512420

[51] Int. Cl.[4] ............... H01L 45/00; H01L 21/306; H01J 40/14; B44C 1/22
[52] U.S. Cl. ......................... 357/2; 136/258; 156/652; 156/653; 156/656; 156/657; 156/659.1; 156/662; 250/211 J; 250/578; 357/30; 357/58; 437/3; 437/61; 437/228
[58] Field of Search .......... 156/650, 652, 653, 655, 156/656, 657, 659.1, 661.1, 662; 29/569 L, 572, 576 W, 580, 437, 3, 61, 228; 357/2, 17, 19, 29, 30, 49, 50, 58; 250/211 R, 211 J, 213 R, 578; 136/249, 257, 258; 358/212, 213, 285, 293, 294

[56] References Cited

U.S. PATENT DOCUMENTS 4,316,206  2/1982  Bottka et al. .................. 357/30
4,482,804 11/1984  Oritsuki et al. ............... 250/211

FOREIGN PATENT DOCUMENTS 2344099  3/1975  Fed. Rep. of Germany .
2132016  6/1984  United Kingdom .

OTHER PUBLICATIONS

Extended Abstracts of the 15th Conference on Solid State Devices and Materials, Tokyo, 1983, pp. 205–208, Tokyo, JP; H. Yamamoto et al.: "High Speed Contact Type Linear Sensor Array Using A-Si Pin Diodes".

Primary Examiner—William A. Powell
Attorney, Agent, or Firm—Oblon, Fisher, Spivak, McClelland & Maier

[57] ABSTRACT

A method of fabricating a light image detector is provided in which there are deposited on a substrate a layer of a conducting material then successively $p^+$ doped, undoped, $n^+$ doped, undoped, then $p^+$ doped semiconductor layers. Then at least one column of material is etched in these layers. The in the column thus obtained, individual detectors are formed solely in the semiconductor layers. The sides of the individual detectors are then irradiated. Finally, line electrodes are deposited in contact with the upper parts of the detectors not covered with an isolating layer.

9 Claims, 9 Drawing Figures

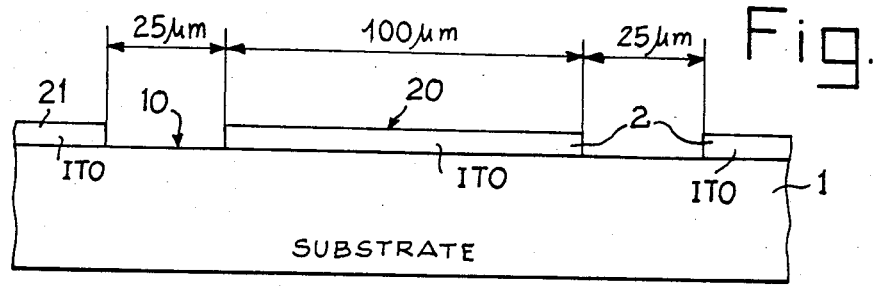
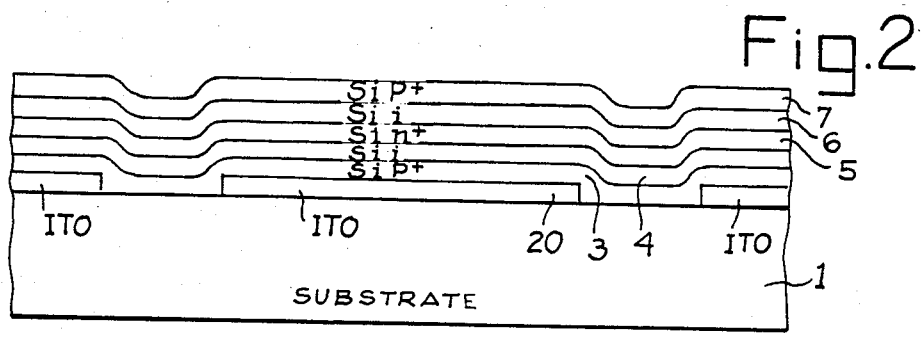
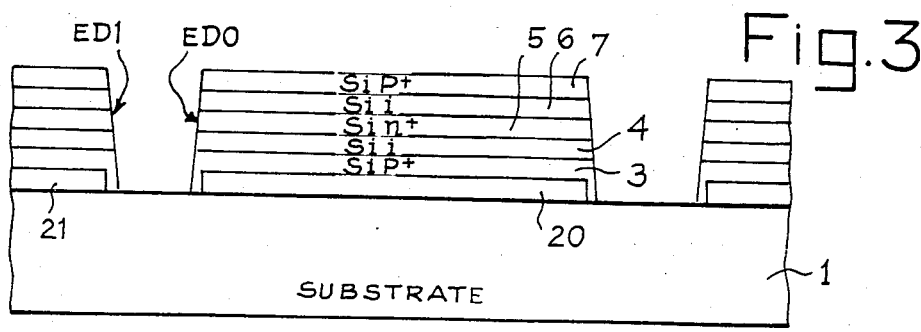
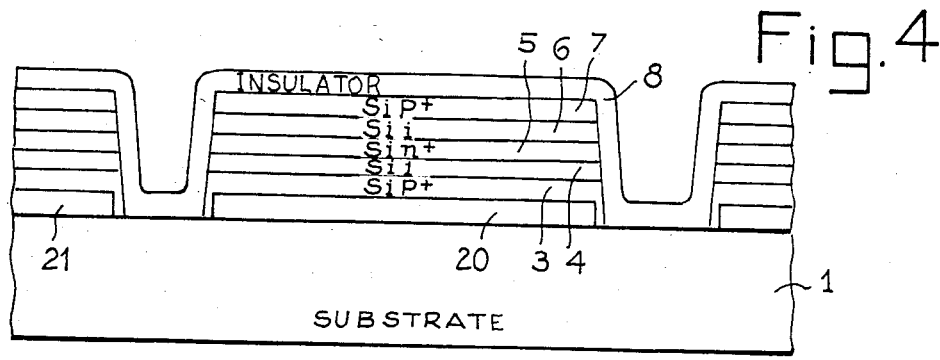

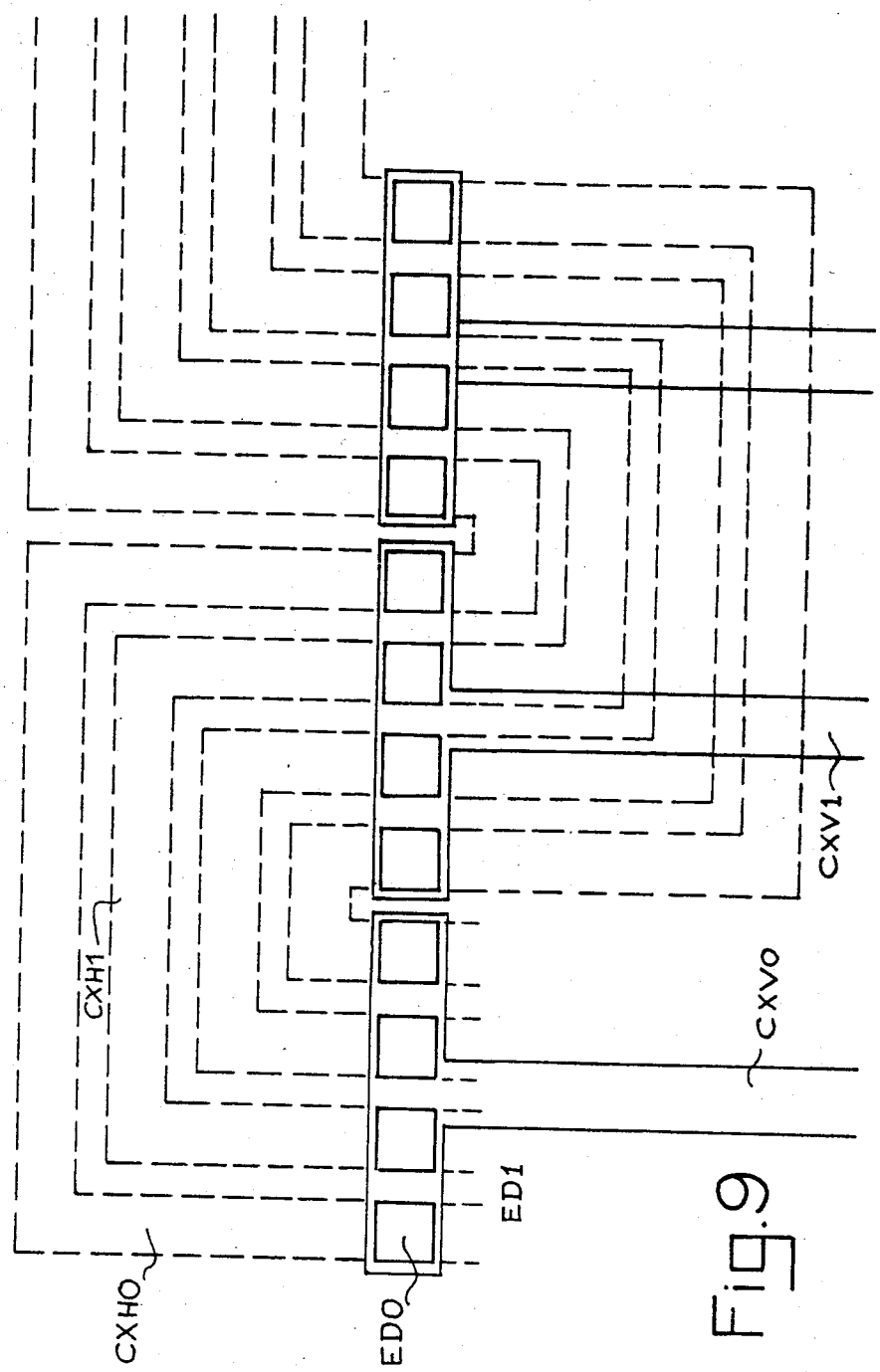

METHOD OF FABRICATING A LIGHT IMAGE DETECTOR AND A LINEAR IMAGE DETECTOR OBTAINED BY THIS METHOD

BACKGROUND OF THE INVENTION

The invention relates to a method of fabricating a light image detector and a linear detector obtained by this method. It relates to the construction of thin film electronic circuits over large areas.

Its application is to be found more particularly in contact facsimile devices without reduction optics.

Since the discovery of the high photoconductivity of amorphous silicon and the ability to deposit it over a large area, numerous applications have been studied and in particular large scale detectors for compact office facsimile machines. Researchers have turned towards integration of the photoconducting elements associated with a blocking electronic device (for blocking the interferences between the photoconductors and reading switches).

The application concerned by the present invention is the integrated control of each elementary point of a light image detector.

At the present time, the main applications associating the high photoconductivity of amorphous silicon with the possibility of forming control electronics in this same material and on the same support relate to linear image detectors, of a large size (up to 20 cm), required for reading A4 format documents by lateral movement of the document with respect to the sensor.

Three different structures have been contemplated for forming such linear detectors,

- the association of a photoconductor, a storage capacity and a thin film transistor (TFT) made from amorphous silicon (a-Si) such as is described in the article by M. MATSUMURA published in the IEEE review Electron Device Letters, EDL-1, p. 182 (1980);
- the association of an amorphous silicon or polycrystalline photodiode such as described in "Extended Abstracts of the 16th Conference on Solid State Devices and Materials", TOKYO (1983), p. 201 to 204 by F. OKUMURA;
- the association of a photodiode and an a-Si blocking diode such as described by Y. YAMAMOTO in "Extended Abstracts of the 15th Conference on Solid State Devices and Materials" Tokyo (1983), p. 205 to 208.

Some of these structures allow devices to be obtained having the following characteristics:

| | |
|---|---|
| Length | 50 mm |
| Resolution | 8 to 10 bits/mm |
| Size of the pixel | 100 μm × 70 μm |
| Reading time | 2 μs/bit without multiplexing. |

It can be assumed from these results that linear detectors will be formed in the near future for reproducing documents under good conditions. For example, for documents of 216 mm in width, at the rate of 8 bits per millimeter and at a travelling speed over the page of 5 ms per line.

An A4 format (216 mm) strip must then represent 1728 photoconductor pairs plus switches so as to have 8 bits/mm or 3456 pairs so as to have 16 bits/mm in the future tendency.

It can be readily understood that such a high number of electronic devices over such a distance requires the simplest structure and technology. This is the first requirement and in this sense the complex structure of thin film transistors (TFT) is not very appropriate.

The second requirement relates to the rapid reading mode of the document, namely about 2 μs/bit Hereagain diodes with high speed photoresponse and switching times appear better adapted than thin film transistors.

The third requirement is integration on the same substrate of the connecting matrix circuit so as to reduce the number of hybrid control circuits and this with the lowest possible number of masking levels.

A last requirement is to elaborate high performing electronic devices having a very low dark current.

The object of the invention concerns a linear image detector associating at each point the photodiode and an amorphous silicon blocking diode and superimposed with integration of the matrix circuit.

According to the invention, Schottky or pin diodes are well adapted especially if the amorphous silicon layers forming the diodes are deposited successively and naturally on the same substrate.

The requirements enumerated above are respected with the advantage that the method of the invention allows such a detector to be obtained with a reduced masking level.

SUMMARY OF THE INVENTION

This is why the invention relates to a method of fabricating a light image detector, comprising the following successive phases:

(a) a first phase of depositing on a face of the substrate a first layer of a conducting material;
(b) a second phase of depositing a first doped amorphous semiconductor layer of a first given type;
(c) a third phase of depositing a second undoped amorphous semiconductor layer;
(d) a fourth phase of depositing a third doped amorphous semiconductor layer of a second given type;
(e) a fifth phase of depositing a fourth undoped amorphous semiconductor layer;
(f) a sixth phase of depositing a fifth doped amorphous semiconductor layer of the first given type;
(g) a seventh phase of etching columns in the five previously deposited semiconductor layers, as well as in the first conducting material layer;
(h) an eighth phase of etching individual detect in the five semiconductor layers of the preceding columns;
(i) a ninth phase of isolating the sides of the individual detectors;
(j) a tenth phase of depositing a second layer of a conducting material;
(k) and an eleventh phase of etching in the second conducting material layer electrical connections to the individual detectors.

The invention also relates to a light image linear detector with matrix control, comprising, deposited in line on the substrate, several assemblies of the same number of individual detectors arranged in the same way in each assembly, each of these detectors including a given number of semiconductor material layers, the layers the closest to the substrate of the individual detectors of the same rank being interconnected by a conductor network deposited on the substrate and the layers the furthest away from the individual detectors of the same assembly being interconnected by a conductor.

BRIEF DESCRIPTION OF THE DRAWINGS

The different objects and characteristics of the invention will now be described with reference to the accompanying Figures which show:

FIGS. 1 to 6, the method of forming detectors in accordance with the invention;

FIG. 9, a top view of a variant of a matrix arrangement of the invention.

DETAILED DESCRIPTION OF THE INVENTION

Figure 5:
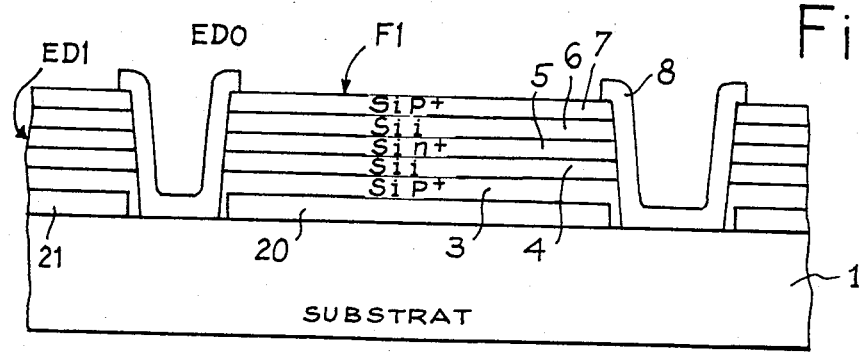

According to the invention, the method of fabricating light image detectors comprises, during a first phase, deposition on a substrate 1, such as glass, of a layer of a conducting material 2 which may, depending on the mode of use, be a transparent material detector as will be seen further on. Thus a fine layer of combined tin and indium oxide (ITO) or an equivalent material ($In_2O_3$, $SnO_2$) is thus deposited. Such a layer will have a thickness of 500 to 1500 Å (1250 Å for example).

During a second phase the conducting material layer 2 is etched so as to obtain a network of parallel conductors (20, 21). Thus a structure is obtained, such as shown in FIG. 1, in which each conductor (20, 21) has a width of 100 μm and are separated by 25 μm so as to have 8 bits per millimeter. The ITO is then annealed so as to make it conducting.

During a third phase, a layer 3 of P doped amorphous silicon is deposited having a thickness of about 300 Å. This deposition is made by a known amorphous silicon deposition method such as luminescent discharge, reactive spraying.

During a fourth phase, a layer 4 of undoped amorphous silicon is deposited by a method identical to that of the preceding phase. This layer has a thickness of about 5000 Å.

During a fifth phase, a layer 5 of N doped amorphous silicon is deposited in the same way as before. This layer has a thickness of about 300 Å.

During a sixth phase, layer 6 of undoped amorphous silicon is deposited by a method identical to that of the preceding phase. This layer has a thickness of about 3000 Å.

During a seventh phase, a layer 7 of N doped amorphous silicon is deposited in the same way as before. This layer has a thickness of about 300 Å.

Thus a structure is obtained such as shown in FIG. 2. The thickness of the five silicon layers 3 to 7 is then about 9000 Å.

During an eighth phase, individual detectors are cut out in these five layers, such as the detectors ED0 and ED1 of FIG. 3. This cutting out phase may be accomplished by photolithography. Such photolithography implies masking requiring each individual detector to be situated on the conductor (20, 21). The masking is followed by dry or chemical etching of the five semiconductor layers 3 to 7.

As can be seen in FIG. 3, there is thus obtained superimposed a PIN type photodiode and an amorphous silicon blocking diode.

However, the amorphous silicon layer 3 could be an N type doped layer, the amorphous silicon layer 5 will then be a P type doped layer and the amorphous silicon 7 will be an N type doped layer. Then a structure is obtained in which the diodes are reversed with respect to the structure shown in FIG. 3.

During a ninth phase, an insulating layer 8 is deposited. The insulating material used may be silica or silicon nitride. The deposition technique used may be luminescent discharge or reactive spraying at a temperature compatible with the nature of the silicon layers already deposited. Thus a structure of the type shown in FIG. 4 is obtained.

Then the insulating material 8 situated on the surface of the P doped semiconductor layer 7 of the detectors ED0, ED1 is removed. This removal of the insulating material may be obtained by chemical plasma etching.

In the case where the conducting material is not transparent, the insulating layer 7 may then be coated with a layer of a negative resin. Then the whole is irradiated through the substrate 1 by means of an irradiation source situated under substrate 1 and not shown in the Figures. Layer 2 serves as a mask for the insulating layer situated above the detectors ED0 ED1 and, after development, the insulating layer situated above the detectors is eliminated. A structure such as shown in FIG. 5 is then obtained.

The insulating layer is also removed in positions situated on the conductors 20, 21.

Figure 7:
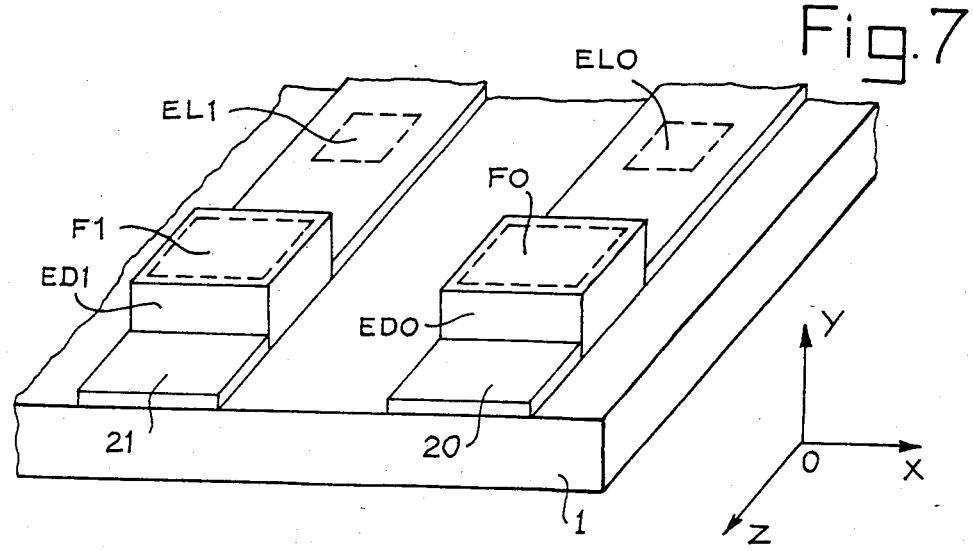
FIG. 7, a simplified perspective view of detectors of the invention.

Thus a structure is obtained such as shown in a simplified way in FIG. 7.

In this Figure, we find a substrate 1 placed parallel to the plane 0XZ of a trihedron OXYZ. The conductors 20 and 21 are oriented in a direction parallel to the axis OZ. The detectors ED0 and ED1 are placed respectively on the conductors 20 and 21. The whole is covered with an insulating layer not shown. On the upper face of the detectors ED0 and ED1 as well as on the conductors 20 and 21 are shown, with broken lines, the windows F0, F1, EL0 and EL1 formed in the insulating layer.

Figure 6:
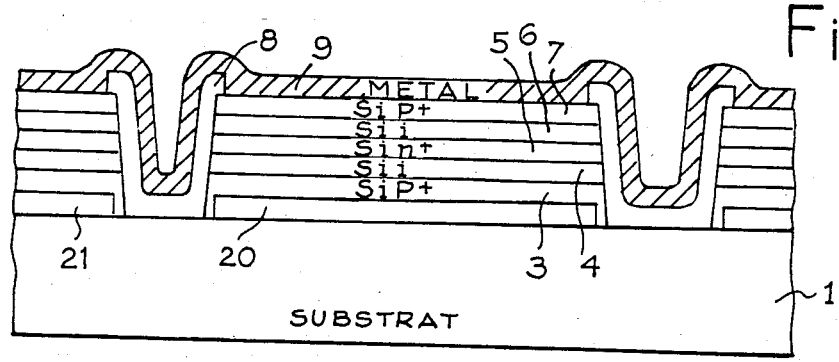

During a tenth phase, a metal layer 9 such as chromium, aluminium, palladium or molybdenum is deposited by evaporation or vacuum cathode spraying. This thickness of layer 9 must be a few 100 Å, 600 Å for example. As shown in FIG. 6, the whole of the preceding structure is covered with a metal layer 9

During an eleventh phase, the metal layer 9 is etched so as to form electric connections for the windows F0, F1, EL0, EL1 towards the external circuits. This etching may be achieved by photolithographic cutting out.

Figure 8:
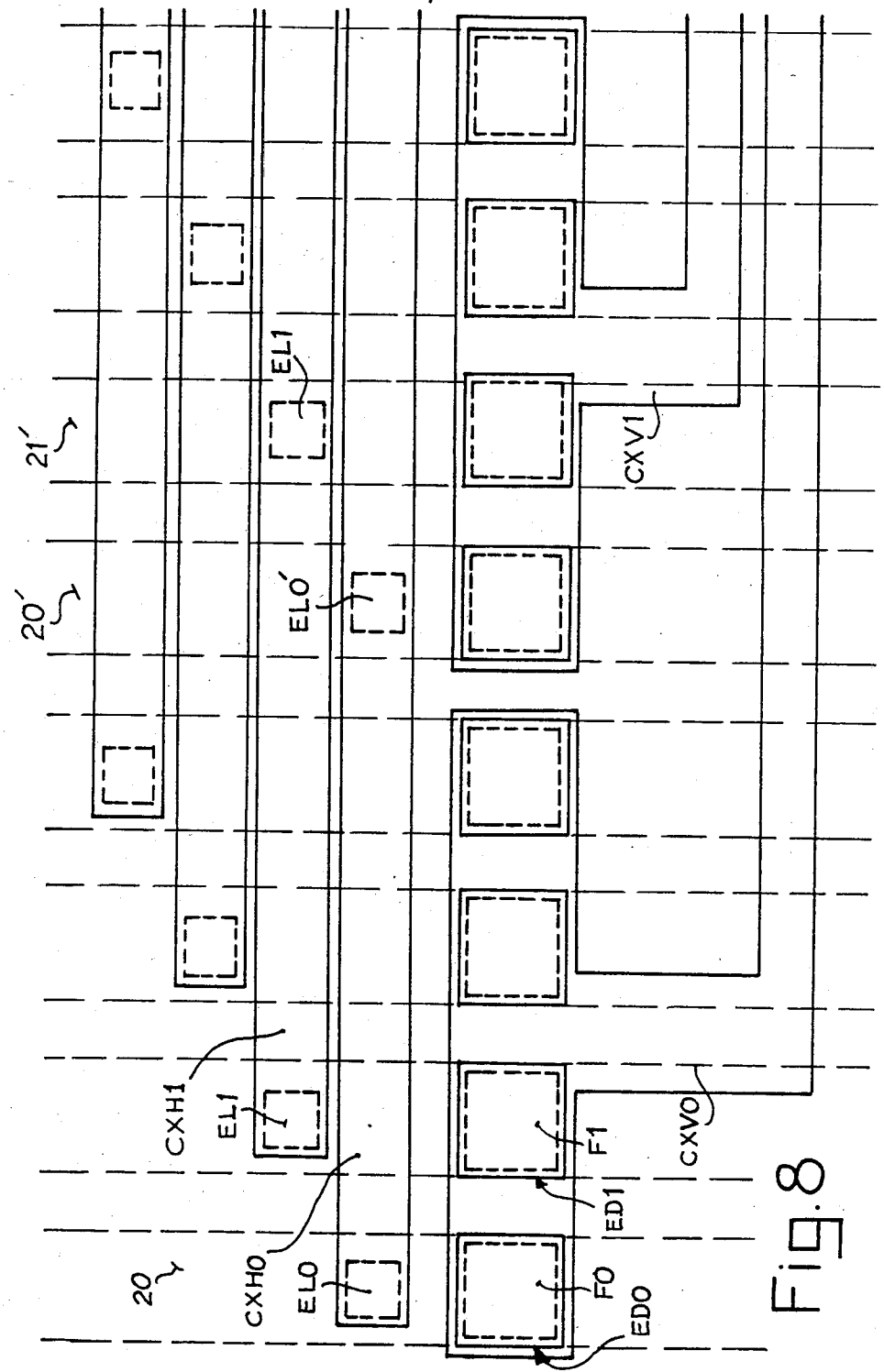
FIG. 8, a top view of a matrix arrangement of detectors of the invention.

As shown in FIG. 8, the individual detectors (ED0, ED1) are disposed linearly and are arranged in groups of four individual detectors for example. In each group the individual detectors are arranged in a given order.

The connection of the windows F0, F1 of the individual detectors ED0, ED1 is accomplished, as shown in FIG. 8, by grouping together by the same vertical connection CXV0, CXV1 a group of individual detectors. Each vertical connection CXV0 CXV1 therefore allows the upper faces (layer 7) of a group of individual detectors to be connected to the external axis circuits not shown.

The connection of the windows EL0, EL1 of the conductors 20, 21, 20', 21' is such that it groups together the conductors giving access to the individual detectors of the same rank in each group of individual detectors. Thus a horizontal connection CXH0 interconnects the windows EL0 and EL0' of conductors 20 and 20' and a horizontal connection CXH1 interconnects the windows EL1 and EL' of the conductors 21 and 21'.

Each horizontal connection CXH0, CXH1 connects, by means of the conductors (such as 20, 21, 20', 21'), the lower layers (layer 3) of the individual detectors of the same rank with external access circuits not shown.

For controlling a given individual detector, a vertical connection and a horizontal connection are selected. For example, the vertical connection CXV0 and the horizontal connection CXH0 allow access to the individual detector ED0. Thus a matrix control of a detector is provided whose individual detectors are disposed linearly.

Another embodiment of the invention is shown in FIG. 9.

The conductors 20, 21 formed on the substrate 1 during the first two phases of the method of the invention, have a sinuous form so that the conductor connects together the individual detectors of the same rank in each group. A horizontal connection (CXH0, CXH1) then corresponds to such a conductor 20, 21 respectively. Removal of the insulating layer at positions situated on conductors 20, 21 and provided for in the above described nin th phase of the method, is therefore no longer required.

Similarly, the formation of horizontal connections provided during the eleventh phase is no longer necessary since these horizontal connections CXH0 and CXH1 have been made in the form of conductors 20, 21.

In a variant of the fabricating method of the invention etching of the conducting material layer 2 is not effected during the preceding second phase. On the other hand, the eighth cutting out phase provides for cutting out parallel columns in the five semiconductor material layers 3 to 7 as well as in the conducting material layer. Such cutting out is then followed by cutting out individual detectors ED0, ED1 in the five semiconductor material layers 3 to 7 of these columns.

This method of operating avoids a problem of positioning the individual detectors (ED0, ED1) on the conductors (20,21).

In another variant of the invention, the fifth P doped semiconductor material layer 7 is not deposited. A metal layer or simply the metal material layer 9 of the vertical connections (CXV0, CXV1) replaces it. Thus, instead of having an NIP type diode at the upper part of each individual detector, a Schottky diode is obtained.

It should be noted that the embodiment of FIGS. 8 and 9 providing groups of four detectors and allowing a four by four matrix control has only been given by way of example. In order to reduce the number of connections and access circuits, it will be possible to provide larger groups and to form for example matrix controls of 42 by 42.

What is claimed is:

1. A method of fabricating a light image detector comprising the following successive phases:
    (a) a first phase of depositing on a face of a substrate a first conducting material layer;
    (b) a second phase of depositing a first doped amorphous semiconducting layer of a first given type (p or n) on said first conducting material layer;
    (c) a third phase of depositing a second undoped amorphous semiconducting layer on said first doped amorphous semiconducting layer;
    (d) a fourth phase of depositing a third doped amorphous semiconducting layer of a second given type (n or p) on said second undoped amorphous semiconducting layer;
    (e) a fifth phase of depositing a fourth undoped amorphous semiconducting layer on said third doped amorphous semiconducting layer;
    (f) a sixth phase of depositing a fifth doped amorphous semiconducting layer of the first given type (p or n) on said fourth undoped amorphous semiconducting layer;
    (g) a seventh phase of etching columns in the five previously deposited semiconductor layers, as well as in the first conducting material layer;
    (h) an eighth phase of etching individual conductors in the five semiconductor layers of the preceeding columns;
    (i) a ninth phase of isolating the sides of the individual detectors;
    (j) a tenth phase of depositing a second conducting material layer on the structure remaining after steps 7-9;
    (k) and an eleventh phase of etching in the second conducting material layer electric connections to the individual detectors.

2. The method of fabricating a light image detector as claimed in claim 1, wherein the first phase of depositing the first conducting material layer is immediately followed by an auxiliary phase of cutting out conducting lines in said first conducting material layer, the seventh etching phase being omitted, the eighth phase then consisting in etching in the five semiconductor layers individual detectors each situated on a conducting line.

3. The method of fabricating the light image detector as claimed in claim 1, wherein the sixth phase consists in depositing a third layer on said fifth doped amorphous semiconducting layer of a conducting material and the phases of etching, in the semiconductor layers which follow the sixth layer, then being practiced in the four semiconductor layers deposited and in said third conducting layer.

4. A method of fabricating a light image detector comprising the following successive phases:
    (a) a first phase of depositing on a face of a substrate a first layer of a conducting material layer;
    (b) a second phase of depositing a first doped amorphous semiconducting layer of a first type (p or n) on said first layer of a conducting material;
    (c) a third phase of depositing a second undoped amorphous semiconducting layer on said first doped amorphous semiconducting layer;
    (d) a fourth phase of depositing a third doped amorphous semiconducting layer of a second given type (n or p) on sid second undoped amorphous semiconducting layer;
    (e) a fifth phase of depositing a fourth undoped amorphous semiconducting layer on said third doped amorphous semiconducting layer;
    (f) a sixth phase of etching columns in the five previously deposited semiconducting layers as well as in the first conducting material layer;
    (g) a seventh phase of etching individual detectors and the five semiconductor layers of the preceeding columns;
    (h) an eighth phase of isolating the sides of the individual detectors;
    (i) a ninth phase of depositing a second conducting material layer on the structure remaining after phases 6-8;

(j) and a tenth phase of etching in the second conducting material layer electric connections to the individual detectors.

5. A method of fabricating a light image detector as claimed in claim 1, wherein the first conducting material layer is opaque and the phase for isolating the sides is achieved by depositing a layer of negative resin on the group of individual detectors, followed by irradiation with a light source through the substrate then a development operation.

6. The method of fabricating a light image detector as claimed in claim 1, wherein the phase of isolating the sides is accomplished by depositing a layer of an isolating material then removing the isolating material on the structure remaining after phases 6 and 7 from the upper face of the individual detectors.

7. The method of fabricating a light image detector as claimed in claim 6, wherein the isolating material is also removed from positions situated on the conducting lines.

8. A image linear detector comprising, deposited in line on a substrate, several groups of the same number of individual detectors arranged in the same way in each group, of these detectors comprising a first conducting material layer on said substrate, a first doped amorphous semiconducting layer of a first given type (p or n) on said first conducting material layer, a second undoped amorphous semiconducting layer on said first doped amorphous semiconducting layer, a third doped amorphous semiconducting layer of a second given type (n or p) on said second undoped amorphous semiconducting layer, a fourth undoped amorphous semiconducting layer on said third doped amorphous semiconducting layer, a fifth doped amorphous semiconducting layer of a first given type (p or n) on said fourth undoped amorphous semiconducting layer, said first conducting material layer and said first through fifth amorphous semiconducting layers having columns etched therein, the columns having individuals conductors etched therein, the sides of the individual detectors being isolated, a second conducted material layer and electrical connections etched in the second conducting material layer, the layers closest to the substrate of the individual detectors of the same rank being interconnected by a network of conductors deposited on the substrate and the layers furthest away from the individual detectors of the same group being interconnected by a conductor.

9. The matrix control light image linear detector as claimed in claim 8, wherein the network of conductors deposited on the substrate is covered as well as the individual detectors by a layer of an insulating material having windows for access to the upper parts of the individual detectors as well as to the conductors, a first connecting ribbon interconnecting the access windows of the individual detectors of the same group and allowing them to be connected to external members, a second connecting ribbon interconnecting the access windows of the conductors of the same rank of the different groups and connecting two external members.

* * * * *